(12) United States Patent
Gani et al.

(10) Patent No.: US 12,557,694 B2
(45) Date of Patent: Feb. 17, 2026

(54) SEMICONDUCTOR PACKAGE WITH GAS RELEASE HOLES

(71) Applicants: STMICROELECTRONICS LTD, Kowloon (HK); STMICROELECTRONICS PTE LTD, Singapore (SG)

(72) Inventors: David Gani, Choa Chu Kang (SG); Hui-Tzu Wang, Zhubei (TW)

(73) Assignees: STMICROELECTRONICS LTD, Kowloon (HK); STMICROELECTRONICS PTE LTD, Singapore (SG)

( * ) Notice: Subject to any disclaimer, the term of this patent is extended or adjusted under 35 U.S.C. 154(b) by 426 days.

(21) Appl. No.: 18/184,436

(22) Filed: Mar. 15, 2023

(65) Prior Publication Data

US 2023/0307302 A1 Sep. 28, 2023

Related U.S. Application Data

(60) Provisional application No. 63/323,898, filed on Mar. 25, 2022.

(51) Int. Cl.
*H01L 23/04* (2006.01)
*H01L 23/00* (2006.01)
*H01L 25/065* (2023.01)

(52) U.S. Cl.
CPC .............. *H01L 23/04* (2013.01); *H01L 24/32* (2013.01); *H01L 25/0655* (2013.01); *H01L 2224/32225* (2013.01); *H01L 2924/16151* (2013.01); *H01L 2924/16788* (2013.01)

(58) Field of Classification Search
CPC ..... H01L 23/04; H01L 24/32; H01L 25/0655; H01L 2224/32225; H01L 2924/16151; H01L 2924/16788
See application file for complete search history.

(56) References Cited

U.S. PATENT DOCUMENTS

| | | | |
|---|---|---|---|
| 7,851,246 B2 | 12/2010 | Camacho et al. | |
| 9,215,361 B2 | 12/2015 | Borthakur et al. | |
| 9,635,228 B2 | 4/2017 | Borthakur et al. | |
| 10,009,523 B2 | 6/2018 | Park et al. | |
| 2009/0032925 A1 | 2/2009 | England | |
| 2012/0068291 A1* | 3/2012 | Kawasaki | H10F 39/804 257/E31.127 |

* cited by examiner

*Primary Examiner* — Peniel M Gumedzoe
(74) *Attorney, Agent, or Firm* — Seed Intellectual Property Law Group LLP

(57) ABSTRACT

A semiconductor package includes a silicon substrate with an active surface and an inactive surface. A semiconductor device, such as an image, light, or optical sensor, is formed in the active surface and disposed on the substrate. A glass plate is coupled to the substrate with adhesive. The glass plate includes a sensor area that corresponds to the area of the semiconductor device and holes through the glass plate that are generally positioned around the sensor area of the glass plate. During formation of the package, the holes through the glass plate allow gas released by the adhesive to escape the package and prevent formation of a gas bubble.

20 Claims, 4 Drawing Sheets

SEMICONDUCTOR PACKAGE WITH GAS RELEASE HOLES

BACKGROUND

Technical Field

The present disclosure is directed to a semiconductor package, and more particularly, to a semiconductor package with holes for releasing gas.

Description of the Related Art

Semiconductor packages are known and include packages that are sensitive to, or capture, light. Such packages typically include a glass plate covering a sensor in order to allow light to pass through the plate and be detected by the sensor. However, known semiconductor packages with glass plates have a number of disadvantages. For example, gas that is released during the formation of the package can become trapped between the glass plate and the sensor. The trapped gas forms a bubble that can result in performance issues for the package, including a reduced sensor accuracy, a weaker bond between the plate and the package, and separation of the glass plate from the package, among others.

One prior solution is to add a dedicated curing step during package formation that aims to release the trapped gas. However, the additional processing step increases costs and the thermal budget for such packages. An additional curing step, and other proposed solutions, have also proven inadequate for releasing trapped gas, especially in larger packages. Thus, it would be advantageous to have a semiconductor package that overcomes the disadvantages of the prior art.

BRIEF SUMMARY

A semiconductor package described herein generally includes a silicon substrate with an active surface and an inactive surface. The substrate may include an "active layer," conductive, or metal layer that defines the active surface. A semiconductor device, such as an image, light, or optical sensor, is formed in the active layer and disposed on the substrate. A glass plate is coupled to the substrate with adhesive. In some examples, the glass plate may be a glass layer or a transparent layer of other material. In other words, the adhesive is between the glass plate and the active layer of the substrate. The glass plate includes a sensor area that corresponds to the area of the semiconductor device and holes through the glass plate that are generally positioned around the sensor area of the glass plate. During formation of the package, the holes through the glass plate allow gas released by the adhesive to escape the package and prevent formation of a gas bubble.

The holes through the glass plate may have a selected number and arrangement. For example, the holes may be in single rows and columns around each side of the sensor or semiconductor device, or may be on only one or two sides of the sensor area. Further, the holes may be arranged in multiple rows and columns on one or more sides of the sensor area with a selected spacing and arrangement between the rows and columns. The semiconductor device may be a light sensor, an image sensor, or an optical sensor with the package further including a corresponding filter for each sensor between the semiconductor device and the glass plate. The package may also include multiple semiconductor devices with the glass plate having multiple sensor areas and corresponding holes for each sensor area.

BRIEF DESCRIPTION OF THE SEVERAL VIEWS OF THE DRAWINGS

The present disclosure will be more fully understood by reference to the following figures, which are for illustrative purposes only. These non-limiting and non-exhaustive embodiments are described with reference to the following drawings, wherein like labels refer to like parts throughout the various views unless otherwise specified. The sizes and relative positions of elements in the drawings are not necessarily drawn to scale in some figures. For example, the shapes of various elements are selected, enlarged, and positioned to improve drawing legibility. In other figures, the sizes and relative positions of elements in the drawings are exactly to scale. The particular shapes of the elements as drawn may have been selected for ease of recognition in the drawings. The figures do not describe every aspect of the teachings disclosed herein and do not limit the scope of the claims.

DETAILED DESCRIPTION

Persons of ordinary skill in the art will understand that the present disclosure is illustrative only and not in any way limiting. Other embodiments of the presently disclosed systems and methods readily suggest themselves to such skilled persons having the assistance of this disclosure.

Each of the features and teachings disclosed herein can be utilized separately or in conjunction with other features and teachings to form variations on such packages. Representative examples utilizing many of these additional features and teachings, both separately and in combination, are described in further detail with reference to attached FIGS. 1-4. This detailed description is merely intended to teach a person of skill in the art further details for practicing aspects of the present teachings and is not intended to limit the scope of the claims. Therefore, combinations of features disclosed in the detailed description may not be necessary to practice the teachings in the broadest sense, and are instead taught merely to describe particularly representative examples of the present teachings.

Figure 1:
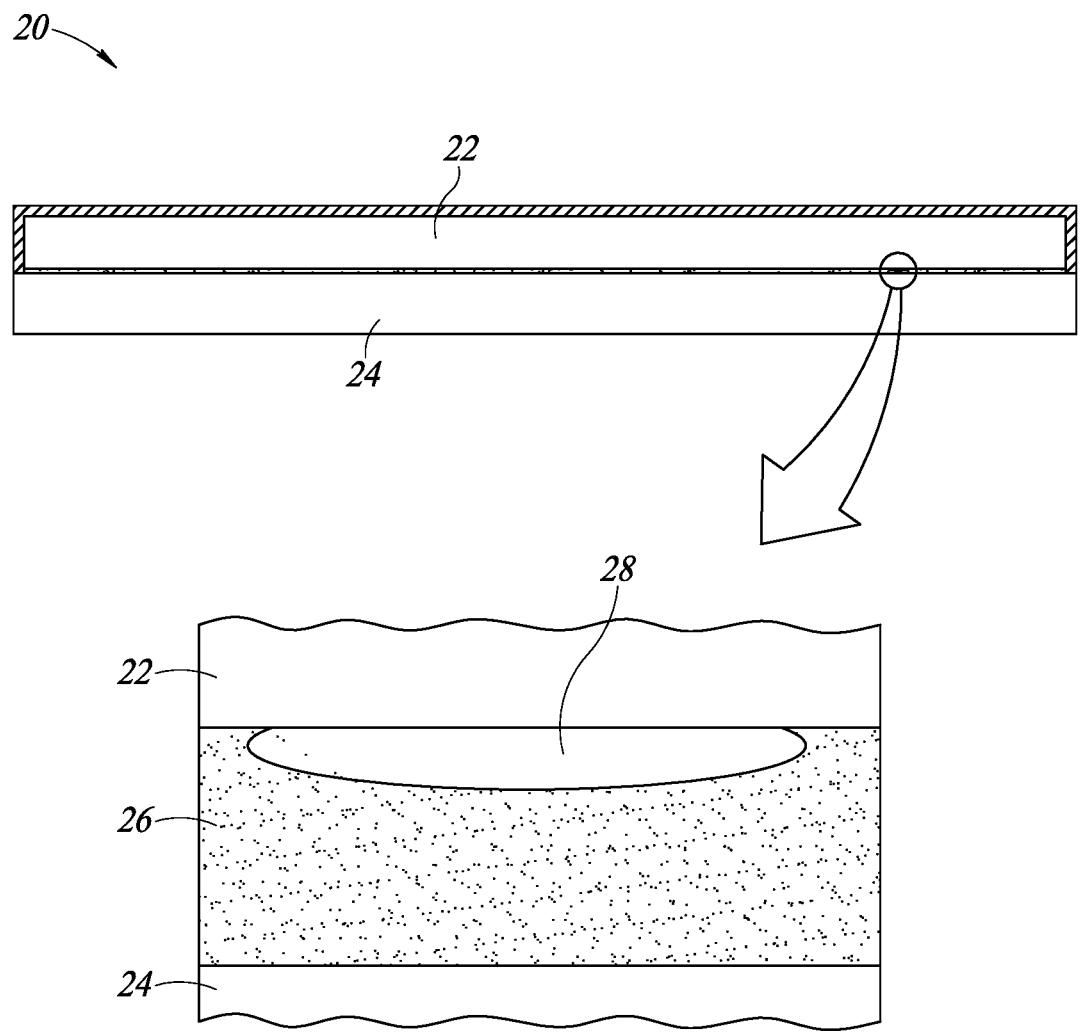
FIG. 1 is a cross-sectional view of a known semiconductor package with a gas bubble in the package.
Figure 2:
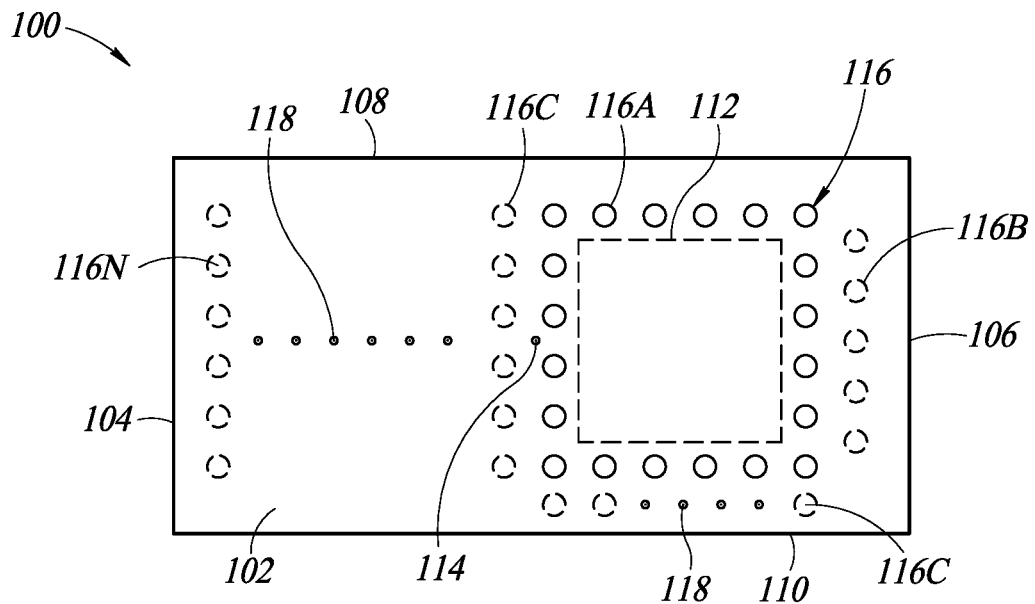
FIG. 2 is a plan view of an embodiment of a semiconductor package with holes through a glass plate of the package according to the present disclosure.

FIG. 1 is a cross-sectional view of a known semiconductor package 20 to provide additional context regarding the benefits and advantages of the concepts of the present disclosure. The package 20 includes a substrate 22 and a glass plate 24 coupled to the substrate 22 with adhesive 26. During formation of the package 20, a gas bubble 28 may form in the adhesive 26. Although the gas bubble 28 is illustrated in FIG. 2 as being located at an interface between the adhesive 26 and the substrate 22, the gas bubble 28 may also form at an interface between the adhesive 26 and the glass plate 24. The gas bubble 28 is the result of heat being applied to the package 20 after deposition of the adhesive 26. More specifically, the gas bubble 28 may result from entrained air in the adhesive 26 that is released during curing of the adhesive 26. Alternatively, the gas bubble 28 may form after the adhesive 26 cures, such as during a subsequent processing step where heat is applied to the package 20 and residual air in the adhesive 26 is released to form the bubble 28. In either event, the gas bubble 28 becomes trapped in the package 20 by the adhesive 26 and can result in multiple issues, including but not limited to, a reduced sensor accuracy, a weaker bond between the glass plate 24 and the substrate 22, and separation of the glass plate 24 from the substrate 22.

FIG. 2 is a plan view of an embodiment of a semiconductor package 100 according to the present disclosure. In particular, FIG. 2 illustrates a glass plate 102 of the package 100 in a plan view. The package 100 includes a first side 104 and a second side 106 opposite to the first side 104 as well as a third side 108 and a fourth side 110 opposite to the third side 108. In the orientation shown in FIG. 2, the first side 104 is a left side, the second side 106 is a right side, the third side 108 is a top side, and the fourth side 110 is a bottom side. The sides 104, 106, 108, 110 of the package 100 may also generally correspond to sides of the glass plate 102. The glass plate 102 includes a sensor area 112 shown in dashed lines. The sensor area 112 generally corresponds to boundaries of a sensor or semiconductor device of the package 100, as described further below. Thus, the four sides of the sensor area 112 in FIG. 2 correspond to four sides of the boundaries of the semiconductor device of the package 100 described in more detail below. For example, if the package 100 is an image or light sensor package, the sensor area 112 may correspond to an area of the image or light sensor of the package 100. Although the sensor area 112 and the package 100 are illustrated as being a square or rectangle for convenience, the sensor area 112 and package 100 can have a selected size and shape.

In an embodiment, the sensor area 112 is offset from a center 114 of the glass plate 102. The center 114 is spaced equidistant from opposite sides 104, 106 and opposite sides 108, 110. The center 114 of the glass plate 102 may also be a boundary line between a first portion of the glass plate 102 to the left of center 114 or above center 114 and a second portion of the glass plate 102 to the right of center 114 or below center 114 in the orientation of FIG. 2. In an embodiment, the sensor area 112 is entirely in one of the first or second portions (i.e., is entirely in an area of the glass plate 102 between the center 114 and one of the first and second sides 104, 106). Alternatively, the sensor area 112 may be aligned with, and extend around, the center 114, or the center 114 may be within the sensor area 112 with the area 112 offset from center 114 and positioned closer to one of the sides 104, 106, 108, 110 than the corresponding opposite side 104, 106, 108, 110 in some embodiments.

The glass plate 102 further includes a plurality of holes 116 through the glass plate 102 that will be described in additional detail throughout the disclosure. In particular, FIG. 2 illustrates a number of non-limiting examples regarding the number and arrangement of the holes 116. A first subset of holes 116A of the plurality of holes 116 are shown in solid lines and are generally arranged around the sensor area 112. More specifically, the first subset of holes 116A are arranged in a continuous square or rectangle shape that corresponds to the sensor area 112. The first subset of holes 116 may include single rows and single columns of holes 116A spaced equidistant from each other about the sensor area 112. In an embodiment, the first subset of holes 116A are aligned exactly with the sensor area 112 (i.e., holes 116A are centered on dashed line 112). The first subset of holes 116A may also have a boundary aligned with the sensor area 112, may at least partially overlap the sensor area 112, or are spaced from the sensor area 112 by a selected distance as in FIG. 2. In a preferred embodiment, the first subset of holes 116A are spaced from a sensor area 112 by a selected distance that corresponds to a field of view of the semiconductor device (i.e., the location of the holes is selected to avoid distorting readings from the semiconductor device).

In yet a further embodiment, the square or rectangular arrangement of the first subset of holes 116A is repeated with multiple concentric shapes (i.e., squares, rectangles, circles, ovals, or any other shape) of holes around the sensor area 112. The first subset of holes 116A may also be arranged in a different pattern or number than that illustrated in FIG. 2. For example, the column of holes 116A to the left of the sensor area 112 may include five holes while the top row of holes 116B above the sensor area 112 includes seven holes with different spacing than the left column of holes 116A in the orientation shown in FIG. 2. Further, the first subset of holes 116A may be positioned on only one side, two sides, three sides, or all sides of the sensor area 116 in a selected number and arrangement on each side.

The plurality of holes 116 further includes a second subset of holes 116B on only one, at least two, at least three, or all sides of the sensor area 112. The second subset of holes 116B are offset in alignment from the first subset of holes 116A. In other words, instead of a concentric arrangement, the holes 116 may also be arranged in successive rows and columns with a selected spacing and arrangement between the rows and columns, as demonstrated by the second subset of holes 116B. In an embodiment, the second subset of holes 116B may be aligned with the space between the first subset of holes 116A. In addition, the second subset of holes 116B may have a different number of holes than the first subset of holes 116A. For example, if the first subset of holes 116A includes six holes per side of the sensor area 112, the second subset of holes 116B may include more or less than holes, such as four holes or eight holes in some non-limiting examples. In addition, the first subset of holes 116A may have different spacing on different sides of the sensor area 112, similar to the spacing shown for the second subset of holes 116B.

A third subset of holes 116C of the plurality of holes 116 are aligned with the first subset of holes 116A in some embodiments, similar to the first subset of holes 116A being repeated in the same or different concentric shapes, as above. However, the third subset of holes 116C may include holes on only one side of the sensor area 112, or on a selected number of sides, instead of being completely around the sensor area 112 as with an example where the pattern of the first subset of holes 116A is repeated in a concentric arrangement. Ellipsis 118 indicate that the third subset of holes 116C can include a selected number of additional rows and columns of holes 116C on selected sides of the sensor area 112 until a final or terminal row or column 116N. With the sensor area 112 being offset from the center 114 of the glass plate 102, the third subset of holes 116C may include multiple columns of holes that extend across the remainder of the glass plate 102. Alternatively, the third subset of holes 116C may terminate at a selected position between the first side 104 and the center 114. Each of the rows or columns in the third subset of holes 116C can likewise have a selected number and arrangement relative to each other, and to the first subset of holes 116A around the sensor area 112, as in the additional examples above.

Figure 3A:
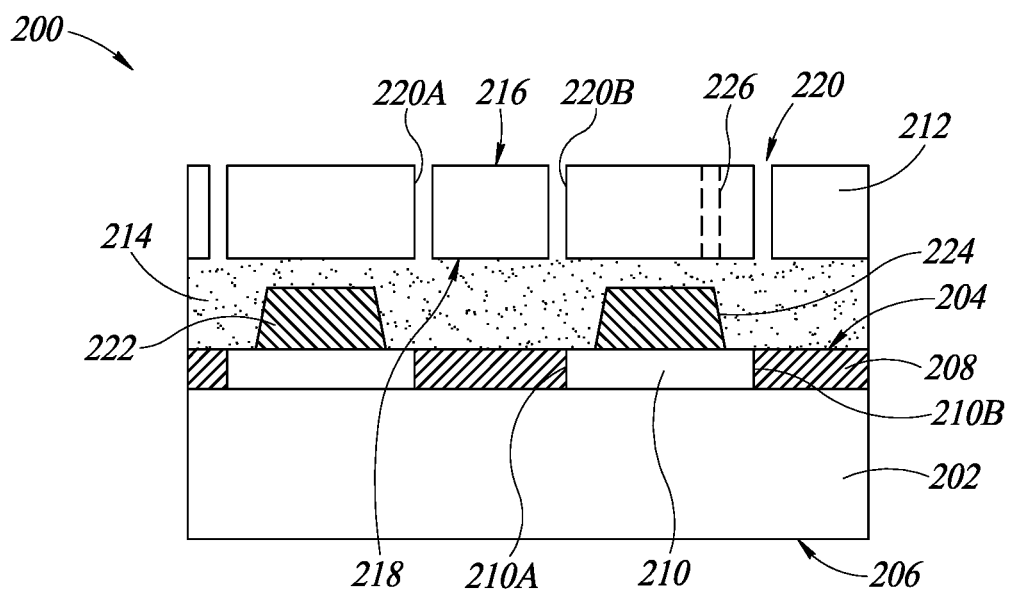
FIGS. 3A-3C are cross-sectional views of an embodiment of processing steps for forming a semiconductor package according the present disclosure.
Figure 3B:
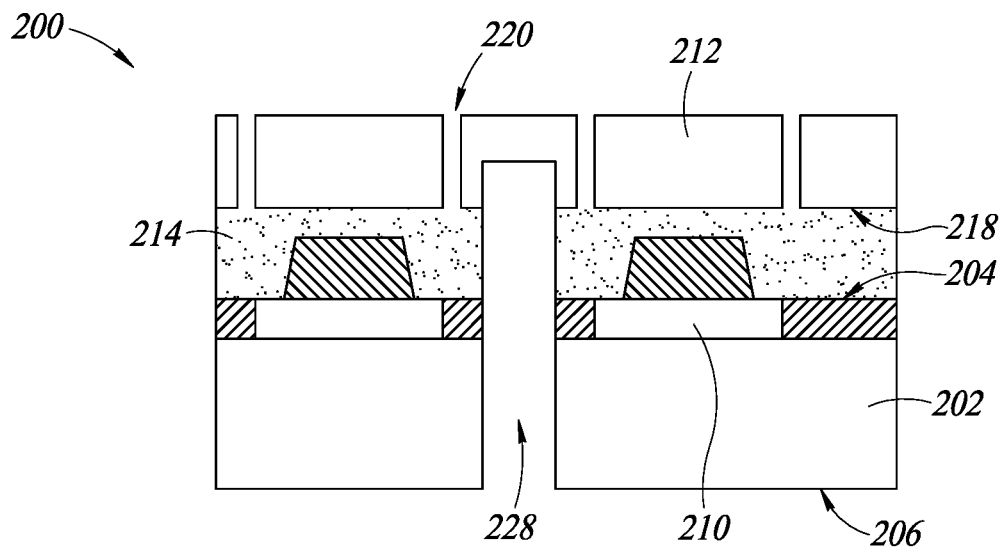
Figure 3C:
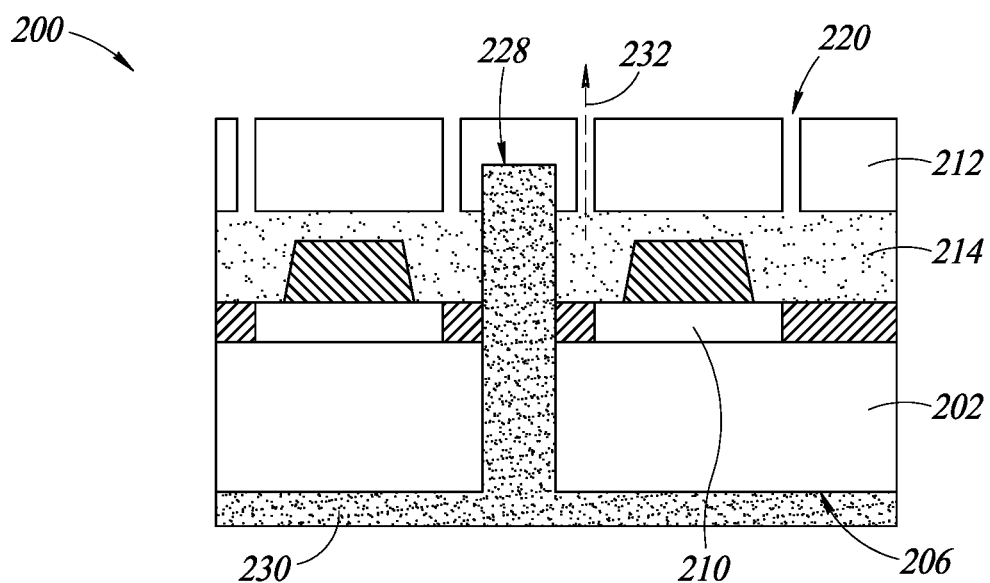

FIGS. 3A-3C are cross-sectional views of an embodiment of processing steps for forming a semiconductor package 200. The package 200 includes a substrate 202 with a first surface 204 and a second surface 206 opposite to the first surface 204. The first surface 204 may be an active surface and the second surface 206 may be an inactive surface in an embodiment. The substrate 202 includes an active layer 208 disposed on the substrate 202. The active layer 208 may be integral with the substrate 202 as a single structure with the active layer 208 defining the first or active surface 204. Thus, there may not be a clear boundary line between the active layer 208 and the substrate 202 in practice, although a boundary is provided in FIGS. 3A-3C to illustrate the concepts of the disclosure. The active layer 208 may also be referred to as a device layer 208, a metal layer 208, or an integrated circuit layer 208.

A semiconductor device 210 of the package 200 includes integrated circuits or circuit architectures, among other devices and electronic components, formed in the active layer 208. Accordingly, the semiconductor device 210 is disposed on the substrate 202. The semiconductor device 210 can be of a selected type or design, although the device 210 is a light, image or optical sensor in preferred embodiments. The processing steps represented by FIGS. 3A-3C are a subset of the manufacturing process of the package 200 and may represent a point in the manufacturing process before final package separation and singulation. Accordingly, while the package 200 is illustrated as including two semiconductor devices 210 in FIGS. 3A-3C, the final package 200 may include only one semiconductor device similar to package 100 in FIG. 2 after additional processing steps. Alternatively, the package 200 may include two or more semiconductor devices 210 in an embodiment.

A glass plate 212 is coupled to the substrate 202 and the semiconductor device 210 with adhesive 214. In some embodiments, the glass plate 212 is replaced with a layer of transparent material that allows light to pass through the layer, and may include various polymers, plastics, silicon, ceramics, resins, and other like materials. The adhesive 214 may be glue, resin, thermosetting compounds, and other like materials. The glass plate 212 includes a first surface 216 and a second surface 218 opposite to the first surface 216 of the glass plate 212. A plurality of holes 220 extend entirely through the glass plate 212 from the first surface 216 to the second surface 218 of the glass plate 212. The holes 220 may be similar to the plurality of first holes 116 discussed with reference to FIG. 2 and may be formed with a drill, a laser, or a wet or dry etch in some embodiments. Further, the holes 220 may be formed during the processing steps shown in FIG. 3A, or may be formed prior to the glass plate 212 being coupled to the substrate 202 with adhesive 214. In an embodiment, the holes 220 extend entirely through the glass plate 212, but do not extend into the adhesive layer 214. In other words, the holes 220 terminate at an interface between the glass plate 212 and the adhesive layer 214 to avoid comprising the structural integrity of the adhesive layer 214 in coupling the glass plate 212 to the substrate 202.

As shown in FIG. 3A, the holes 220 are aligned with boundaries of the semiconductor devices 210. Specifically, a first sidewall 220A and a second sidewall 220B of the glass plate 212 define boundaries of the holes 220 on opposite sides of the holes 220. The semiconductor device 210 includes a first side 210A and a second side 210B opposite to the first side 210A. Although not shown in the cross-sectional view of FIG. 3A, the semiconductor device 210 may also have a third side and a fourth side opposite the third side in a square or rectangular shape similar to the sensor area 112 of FIG. 2. In an embodiment, the first sidewall 220A or the second sidewall 220B of the glass plate 212, and thus one boundary or side of each hole 220, is aligned with the sides 210A, 210B of the semiconductor device.

The package 200 may optionally include a filter 222 associated with, and disposed on, each semiconductor device 210 that assists with operation of the semiconductor device 210 by filtering or otherwise distorting light depending on the intended use or operation of the package 200. The filter 222 may be selected to be a number of different types of filters known for use with, or inclusion in, semiconductor packages. In an embodiment, the holes 220 are aligned with at least a portion of a sidewall 224 of the filter as shown by dashed lines 226 through the glass plate 212. In some non-limiting examples, either of the first and second sidewalls 220A, 220B may be aligned with a selected portion of the sidewall 224 of the filter 222, such as a midpoint of the sidewall 224, a top of the sidewall 224, a bottom of the sidewall 224, or anywhere in between. The holes 220 may also be spaced from the sidewall 224 of the filter 222 and the sides 210A, 210B of the semiconductor device 210 as in FIG. 2.

The filter 222 may occupy an area on the semiconductor device 210 that is less than the area of the semiconductor device 210, or the filter 222 may occupy the entire area of the semiconductor device 210 and be aligned with the sides 210A, 210B of the semiconductor device 210. Thus, the holes 220 may be aligned with both the sides 210A, 210B of the semiconductor device and at least a portion of the sidewall 224 of the filter 222 in an embodiment. The filter 222 may also extend beyond the sides 210A, 210B of the semiconductor device 210. The holes 220 are preferably positioned proximate to, or in alignment with, the sides 210A, 210B of the semiconductor device 210 or the sidewall 224 of the filter 222, or both, because the adhesive 214 is thicker at these locations and thus gas bubbles are more likely to form. In addition, the holes 220 are positioned in alignment with, or outside of, an area of the glass plate 212 defined by the semiconductor device 210, such as sensor area 112 in FIG. 2, to prevent the holes 220 from distorting the accuracy of, or otherwise impacting, the performance of the semiconductor device 210 in a preferred embodiment.

Turning to FIG. 3B, a cavity or trench 228 is formed in the package 200 with a saw or a sawing process. The cavity 228 extends through the substrate 202 from the second surface 206 to the first surface, through the adhesive layer 214 and at least partially into, but not through, the glass plate 212. In other words, the cavity 228 extends through a majority of the package 200 before terminating in the glass plate 212. The depth of the cavity 228 can be selected and thus the cavity 228 may terminate in the adhesive layer 214 or at other locations in the package 200 in some embodiments. The cavity 228 is positioned between semiconductor devices 210 of the package 200 and does not extend through the devices 210. Further, the arrangement of the holes 220 proximate to, or in alignment with, the semiconductor devices 210 provides an area of the glass plate 212 without holes 220 to enable formation of the cavity 228 in the package 200 without jeopardizing the structural integrity of the package 200 or the glass plate 212.

In FIG. 3C, a planarization layer 230 is deposited on the package 200, which may be a solder layer applied with a solder mask. The planarization layer 230 covers all of, or at least a portion of, the second surface 206 of the substrate 202 and completely fills the cavity 228. The planarization layer 230 is applied with heat and therefore transfers heat into the package 200. In a conventional package, such as package 20 in FIG. 1, the heat introduced to the package at this step can produce the gas bubble 28 because the adhesive 26 releases entrained air under the heat from formation of the planarization layer 230. In comparison, the holes 220 in the package 200 according to the concepts of the disclosure allow gas to be released from the package 200 through the holes 220, as generally shown by arrow 232, thereby preventing the formation of gas bubbles in the package 200. In other words, each of the holes 220 define a gas flow path from the adhesive 214, through the glass plate 212, and to an external environment outside of the package 200 to prevent the formation of gas bubbles in both large and small packages. The processing steps of FIGS. 3A-3C can be integrated into existing processing flows for the package 200 and do not create additional processing or curing steps that increase the thermal budget for manufacturing the package 200.

After the planarization layer 230 is formed in FIG. 3C, the package 200 may undergo further processing, including separating the package 200 into individual units each having one semiconductor device 210. In an embodiment, the holes 220 remain open to an external environment throughout the remaining processing steps and in the final completed package. Alternatively, the holes may be filled in the final package with a selected material, such as any material described herein.

Figure 4:
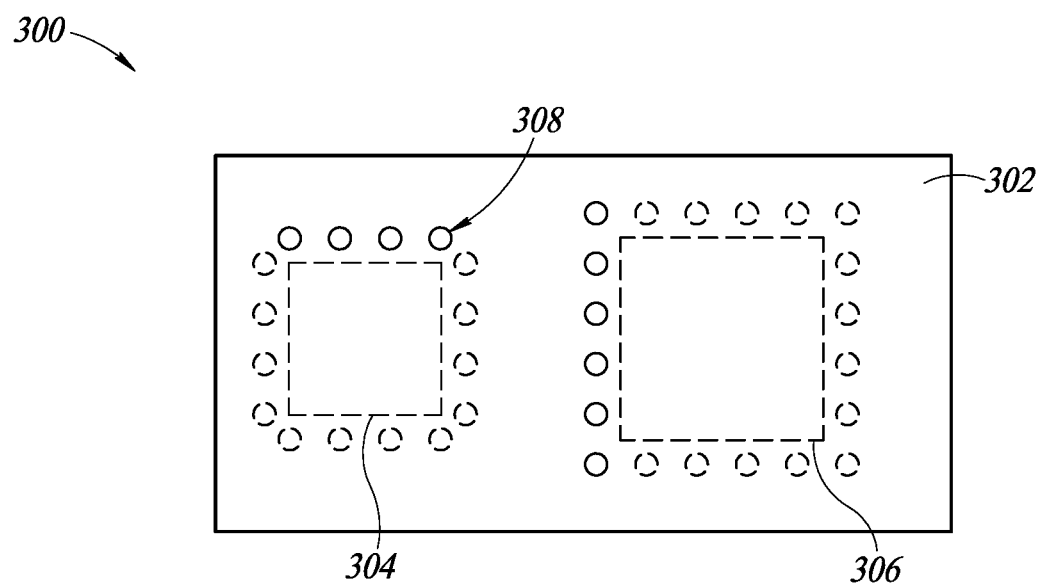
FIG. 4 is a plan view of an embodiment of a semiconductor package with multiple sensors and corresponding holes through a glass plate of the package according to the present disclosure.

FIG. 4 is a plan view of an embodiment of a semiconductor package 300 with multiple sensors. Specifically, the package 300 includes a glass plate 302 with a first sensor area 304 and a second sensor area 306 corresponding to boundaries of semiconductor devices or sensors of the package 300. The sensor areas 304, 306 may have the same or a different size depending on the type and size of semiconductor devices in the package 300. A plurality of holes 308 extend through the glass plate 302 around each sensor area 304, 306. The holes 308 corresponding to each sensor area 304, 306 may be in the same location (i.e., on the same side of each sensor area 304, 306) or may selected to be different for each sensor area 304, 306. Further, as shown by the holes 308 associated with the first sensor area 304, the holes may have an irregular spacing around the sensor area 304 with holes 308 at the corners of the sensor area 304 being positioned closer to each other than the remaining holes 308. Accordingly, the concepts of the disclosure are not limited to packages with only one sensor, but rather, can include packages with two or more sensors as in FIG. 4.

In view of the above, the present disclosure is directed to a semiconductor package with holes through a glass plate of the package for releasing gas that would otherwise be trapped in the package. The concepts of the disclosure are adapted for use with existing manufacturing processes and thus do not introduce additional steps or increase the thermal budget for manufacturing the package. Accordingly, the concepts of the disclosure have distinct advantages over the prior art and prior solutions, including but not limited to, being more efficient, cost effective, effective in releasing gas, and improved performance.

One or more embodiments of a device according to the present disclosure may be summarized as including: a substrate; a semiconductor device disposed on the substrate; a glass plate disposed on the substrate, the glass plate having a first surface, a second surface opposite to the first surface, and a sensor area corresponding to the semiconductor device; an adhesive between the semiconductor device and the glass plate; and a plurality of holes through the glass plate from the first surface to the second surface that terminate at an interface between the glass plate and the adhesive, the plurality of holes arranged around at least a portion of the sensor area of the glass plate.

In an embodiment, the sensor area includes a plurality of sides, the plurality of holes arranged on only one side of the sensor area of the glass plate.

In an embodiment, the plurality of holes are arranged around an entirety of the sensor area of the glass plate.

In an embodiment, the glass plate includes the plurality of holes only proximate the sensor area.

In an embodiment, the plurality of holes are aligned with the at least one side of the sensor area of the glass plate.

In an embodiment, the device further includes a filter between the semiconductor device and the glass plate.

In an embodiment, the plurality of holes define a plurality of gas flow paths through the glass plate in communication with the adhesive.

One or more embodiments of a device may be summarized as including: a semiconductor device; a glass plate disposed on the semiconductor device having a sensor area; an adhesive between the semiconductor device and the glass plate; and a plurality of holes only through the glass plate proximate the sensor area of the glass plate.

In an embodiment, the device further includes a substrate with the semiconductor device disposed on the substrate.

In an embodiment, the glass plate includes a first surface facing the adhesive and a second surface opposite to the first surface with the plurality of holes extending through the glass plate from the first surface to the second surface and terminating at an interface between the glass plate and the adhesive.

In an embodiment, the sensor area of the glass plate corresponds to boundaries of the semiconductor device.

In an embodiment, the plurality of holes are arranged on at least two sides of the sensor area.

In an embodiment, the plurality of holes are arranged on every side of the sensor area.

In an embodiment, each of the plurality of holes are open to an external environment.

One or more embodiments of a device may be summarized as including: a substrate; a semiconductor device disposed on the substrate, the semiconductor device having a first side and a second side opposite to the first side; a glass plate disposed on the semiconductor device; an adhesive between the semiconductor device and the glass plate; and a plurality of holes through the glass plate, the plurality of holes aligned proximate the first side and the second side of the semiconductor device.

In an embodiment, the semiconductor device includes a third side and a fourth side, the plurality of holes aligned proximate the third side and the fourth side of the semiconductor device.

In an embodiment, the plurality of holes extend only through the glass plate and terminate at an interface between the glass plate and the adhesive.

In an embodiment, the glass plate includes a first surface and a second surface, the plurality of holes extending through the glass plate from the first surface to the second surface.

In an embodiment, the plurality of holes include only a single row of holes or only a single column of holes aligned proximate the first side of the semiconductor device and only a single row of holes or a single column of holes aligned proximate the second side of the semiconductor device.

In an embodiment, each row or column of holes includes at least two holes.

In the above description, certain specific details are set forth in order to provide a thorough understanding of various embodiments of the disclosure. However, one skilled in the art will understand that the disclosure may be practiced without these specific details. In other instances, well-known structures associated with electronic components, packages, and semiconductor fabrication techniques have not been described in detail to avoid unnecessarily obscuring the descriptions of the embodiments of the present disclosure.

While various embodiments are shown and described with respect to silicon die, it will be readily appreciated that embodiments of the present disclosure are not limited thereto. In various embodiments, the structures, devices, methods and the like described herein may be embodied in or otherwise utilized in any suitable type or form of semiconductor die, and may be manufactured utilizing any of a number of suitable semiconductor die and packaging technologies.

Certain words and phrases used in the specification are set forth as follows. As used throughout this document, including the claims, the singular form "a", "an", and "the" include plural references unless indicated otherwise. Any of the features and elements described herein may be singular, e.g., a die may refer to one die. The terms "include" and "comprise," as well as derivatives thereof, mean inclusion without limitation. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Other definitions of certain words and phrases are provided throughout this disclosure.

The use of ordinals such as first, second, third, etc., does not necessarily imply a ranked sense of order, but rather may only distinguish between multiple instances of an act or a similar structure or material.

Throughout the specification, claims, and drawings, the following terms take the meaning explicitly associated herein, unless the context clearly dictates otherwise. The term "herein" refers to the specification, claims, and drawings associated with the current application. The phrases "in one embodiment," "in another embodiment," "in various embodiments," "in some embodiments," "in other embodiments," and other derivatives thereof refer to one or more features, structures, functions, limitations, or characteristics of the present disclosure, and are not limited to the same or different embodiments unless the context clearly dictates otherwise. As used herein, the term "or" is an inclusive "or" operator, and is equivalent to the phrases "A or B, or both" or "A or B or C, or any combination thereof," and lists with additional elements are similarly treated. The term "based on" is not exclusive and allows for being based on additional features, functions, aspects, or limitations not described, unless the context clearly dictates otherwise. In addition, throughout the specification, the meaning of "a," "an," and "the" include singular and plural references.

Where a range of values is provided, it is understood that each intervening value in the range, to the tenth of the unit, is encompassed within embodiments of the disclosure unless the context dictates otherwise. The upper and lower limits of the ranges are included within embodiments of the disclosure, subject to any specifically excluded limit in the stated range. Where the stated range includes one or both of the limits, ranges excluding either or both of those included limits are also included in the present disclosure.

Generally, unless otherwise indicated, the materials for making the invention and/or its components may be selected from appropriate materials such as metal, metallic alloys (high strength alloys, high hardness alloys), composite materials, ceramics, intermetallic compounds, plastic, 3D printable materials, polymers, semiconductor materials, plastic compounds, and the like.

The foregoing description, for purposes of explanation, uses specific nomenclature and formula to provide a thorough understanding of the disclosed embodiments. It should be apparent to those of skill in the art that the specific details are not required in order to practice the invention. The embodiments have been chosen and described to best explain the principles of the disclosed embodiments and its practical application, thereby enabling others of skill in the art to utilize the disclosed embodiments, and various embodiments with various modifications as are suited to the particular use contemplated. Thus, the foregoing disclosure is not intended to be exhaustive or to limit the invention to the precise forms disclosed, and those of skill in the art recognize that many modifications and variations are possible in view of the above teachings.

The terms "top," "bottom," "upper," "lower," "left," "right," and other like derivatives are used only for discussion purposes based on the orientation of the components in the Figures of the present disclosure. These terms are not limiting with respect to the possible orientations explicitly disclosed, implicitly disclosed, or inherently disclosed in the present disclosure and unless the context clearly dictates otherwise, any of the aspects of the embodiments of the disclosure can be arranged in any orientation.

As used herein, the term "substantially" is construed to include an ordinary error range or manufacturing tolerance due to slight differences and variations in manufacturing semiconductor packages. Unless the context clearly dictates otherwise, relative terms such as "approximately," "substantially," and other derivatives, when used to describe a value, amount, quantity, or dimension, generally refer to a value, amount, quantity, or dimension that is within plus or minus 5% of the stated value, amount, quantity, or dimension, unless the context clearly dictates otherwise. It is to be further understood that any specific dimensions of components or features provided herein are for illustrative purposes only with reference to the various embodiments described herein, and as such, it is expressly contemplated in the present disclosure to include dimensions that are more or less than the dimensions stated, unless the context clearly dictates otherwise.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the breadth and scope of a disclosed embodiment should not be limited by any of the above-described embodiments, but should be defined only in accordance with the following claims and their equivalents.

The invention claimed is:

1. A device, comprising:
   a substrate;
   a semiconductor device on the substrate;
   a glass plate on the substrate, the glass plate having a first surface, a second surface opposite to the first surface, and a sensor area corresponding to the semiconductor device;

an adhesive between the semiconductor device and the glass plate; and a plurality of holes through the glass plate from the first surface to the second surface that each expose a top surface of the adhesive, the plurality of holes arranged around at least a portion of the sensor area of the glass plate.

2. The device of claim 1, wherein the sensor area includes a plurality of sides, the plurality of holes arranged on only one side of the sensor area of the glass plate.

3. The device of claim 1, wherein the plurality of holes are arranged around an entirety of the sensor area of the glass plate.

4. The device of claim 1, wherein the glass plate includes the plurality of holes only proximate the sensor area.

5. The device of claim 1, wherein the plurality of holes are aligned with the at least one side of the sensor area of the glass plate.

6. The device of claim 1, further comprising:

a filter between the semiconductor device and the glass plate.

7. The device of claim 1, wherein each of the plurality of holes:

i) defines a plurality of gas flow paths through the glass plate in communication with the top surface of the adhesive;
 ii) is open to an external environment; or
 iii) both i) and ii).

8. A device, comprising:

a semiconductor device;

a glass plate on the semiconductor device having a sensor area;

an adhesive between the semiconductor device and the glass plate; and a plurality of holes only through the glass plate proximate the sensor area of the glass plate, wherein the plurality of holes each expose a top surface of the adhesive.

9. The device of claim 8, further comprising:

a substrate, the semiconductor device disposed on the substrate.

10. The device of claim 8, wherein the glass plate includes a first surface facing the adhesive and a second surface opposite to the first surface, the plurality of holes extending through the glass plate from the first surface to the second surface.

11. The device of claim 8, wherein the sensor area of the glass plate corresponds to boundaries of the semiconductor device.

12. The device of claim 8, wherein the plurality of holes are arranged on at least two sides of the sensor area.

13. The device of claim 8, wherein the plurality of holes are arranged on every side of the sensor area.

14. The device of claim 8, wherein each of the plurality of holes:

i) defines a gas flow path through the glass plate in communication with the top surface of the adhesive;
 ii) is open to an external environment; or
 iii) both i) and ii).

15. A device, comprising:

a substrate;

a semiconductor device on the substrate, the semiconductor device having a first side and a second side opposite to the first side;

a glass plate on the semiconductor device;

an adhesive between the semiconductor device and the glass plate; and a plurality of holes through the glass plate, the plurality of holes aligned proximate the first side and the second side of the semiconductor device, wherein the plurality of holes each expose a top surface of the adhesive.

16. The device of claim 15, wherein the semiconductor device includes a third side and a fourth side, the plurality of holes aligned proximate the third side and the fourth side of the semiconductor device.

17. The device of claim 15, wherein the glass plate includes a first surface and a second surface, the plurality of holes extending through the glass plate from the first surface to the second surface.

18. The device of claim 15, wherein the plurality of holes include only a single row of holes or only a single column of holes aligned proximate the first side of the semiconductor device and only a single row of holes or a single column of holes aligned proximate the second side of the semiconductor device.

19. The device of claim 18, wherein each row or column of holes includes at least two holes.

20. The device of claim 15, wherein each of the plurality of holes:

i) defines a gas flow path through the glass plate in communication with the top surface of the adhesive;
 ii) is open to an external environment; or
 iii) both i) and ii).

* * * * *